US012787163B2

(12) United States Patent
Shibata et al.

(10) Patent No.: US 12,787,163 B2

(45) Date of Patent: Nov. 3, 2026

(54) WIRING CIRCUIT BOARD

(71) Applicant: NITTO DENKO CORPORATION, Osaka (JP)

(72) Inventors: Shusaku Shibata, Osaka (JP); Takaya Kouchi, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 282 days.

(21) Appl. No.: 18/444,079

(22) Filed: Feb. 16, 2024

(65) Prior Publication Data

US 2024/0292528 A1 Aug. 29, 2024

(30) Foreign Application Priority Data

Feb. 28, 2023 (JP) ................................ 2023-029956

(51) Int. Cl.

| | |
|---|---|
| ***H05K 1/02*** | (2006.01) |
| ***H01R 12/71*** | (2011.01) |
| ***H01R 13/02*** | (2006.01) |
| ***H05K 1/05*** | (2006.01) |
| ***H05K 1/181*** | (2026.01) |
| ***H05K 3/28*** | (2006.01) |
| ***H05K 3/44*** | (2006.01) |

(52) U.S. Cl.

CPC .................................. *H05K 1/0296* (2013.01)

(58) Field of Classification Search

CPC .... H05K 1/0296; H05K 1/056; H05K 1/0245; H05K 1/02; H05K 1/05; H05K 1/181; H05K 1/111; H05K 2203/059; H05K 3/287; H05K 3/28; H01R 12/71; H01R 13/02

See application file for complete search history.

(56) References Cited

U.S. PATENT DOCUMENTS

| | | | | |
|---|---|---|---|---|
| 2005/0115066 | A1 | 6/2005 | Honjo et al. | |
| 2012/0279757 | A1 | 11/2012 | Ishii et al. | |
| 2016/0262265 | A1 * | 9/2016 | Tanabe .................. | G11B 5/484 |
| 2022/0256712 | A1 | 8/2022 | Takimoto et al. | |

FOREIGN PATENT DOCUMENTS

| | | | |
|---|---|---|---|
| JP | H03-230595 | A | 10/1991 |
| JP | 2005-158848 | A | 6/2005 |
| JP | 2005-311106 | A | 11/2005 |
| JP | 2008-071948 | A | 3/2008 |
| JP | 2012-235013 | A | 11/2012 |
| JP | 2020-188189 | A | 11/2020 |

OTHER PUBLICATIONS

WO 2021124879 English translation (Year: 2021).*

* cited by examiner

*Primary Examiner* — Timothy J Thompson

*Assistant Examiner* — Amol H Patel

(74) *Attorney, Agent, or Firm* — Edwards Neils LLC; Jean C. Edwards, Esq.

(57) ABSTRACT

A wiring circuit board includes a base insulating layer, a conductive layer, and a cover insulating layer. The conductive layer has a terminal and a wiring. The wiring has a body portion and a connecting portion. The connecting portion connects the body portion to the terminal. The cover insulating layer has a cover body portion and a protruding portion. The cover body portion covers the body portion. The protruding portion covers the connecting portion. The protruding portion protrudes from the cover body portion.

15 Claims, 6 Drawing Sheets

WIRING CIRCUIT BOARD

CROSS-REFERENCE TO RELATED APPLICATION

The present application claims priority from Japanese Patent Application No. 2023-29956 filed on Feb. 28, 2023, the contents of which are hereby incorporated by reference into this application.

TECHNICAL FIELD

The present invention relates to a wiring circuit board.

BACKGROUND ART

A wiring circuit board including a base insulating layer, a conductive layer disposed on one surface of the base insulating layer in a thickness direction, and a cover insulating layer disposed on one surface of the base insulating layer in the thickness direction and covering a portion of the conductive layer is known (ref: for example, Patent Document 1 below).

In the wiring circuit board described in Patent Document 1, the conductive layer has a terminal, and a wiring having a width narrower than the width of the terminal. The cover insulating layer exposes the terminal, while covering the wiring.

CITATION LIST

Patent Document

Patent Document 1: Japanese Unexamined Patent Publication No. 2020-188189

SUMMARY OF THE INVENTION

Problem to be Solved by the Invention

There is a disadvantage that a connecting portion connected to the terminal in the wiring may be exposed in accordance with applications of the wiring circuit board, and the connecting portion is likely to be peeled from the base insulating layer.

The present invention provides a wiring circuit board capable of suppressing peeling of a connecting portion from a base insulating layer.

Means for Solving the Problem

The present invention [1] includes a wiring circuit board including a base insulating layer, a conductive layer disposed on one surface of the base insulating layer in a thickness direction, and a cover insulating layer disposed on one surface of the base insulating layer in the thickness direction and covering a portion of the conductive layer, wherein the conductive layer has a terminal, and a wiring connected to the terminal and having a width narrower than the width of the terminal; the wiring has a body portion, and a connecting portion connecting the body portion to the terminal; and the cover insulating layer has a cover body portion covering the body portion, and a protruding portion covering the connecting portion and protruding from the cover body portion.

In this wiring circuit board, the cover insulating layer has a protruding portion covering the connecting portion. Therefore, it is possible to suppress peeling of the connecting portion from the base insulating layer.

The present invention [2] includes the wiring circuit board described in [1], wherein a direction in which the connecting portion extends is different from a direction in which the body portion extends.

When the direction in which the connecting portion extends is different from the direction in which the body portion extends, the connecting portion is likely to be exposed.

However, in this wiring circuit board, since the protruding portion covers the connecting portion, it is possible to suppress the peeling caused by the exposure of the connecting portion.

The present invention [3] includes the wiring circuit board described in [1] or [2], wherein the cover body portion has an end edge along a first direction perpendicular to the thickness direction, and the protruding portion protrudes in a second direction being perpendicular to the thickness direction and crossing the first direction.

In this wiring circuit board, since the protruding portion protrudes in the second direction crossing the first direction, it is possible to reliably cover the connecting portion.

The present invention [4] includes the wiring circuit board described in [3], wherein the body portion is along the first direction.

The present invention [5] includes the wiring circuit board described in [4], wherein the terminal includes a first terminal and a second terminal, the wiring includes a first wiring and a second wiring, the first wiring includes a first body portion and a first connecting portion, the second wiring includes a second body portion and a second connecting portion, and the first wiring and the second wiring are a differential wiring.

In this wiring circuit board, since the first connecting portion and the second connecting portion are covered with the protruding portion, it is possible to reliably suppress the peeling of the first connecting portion and the second connecting portion.

The present invention [6] includes the wiring circuit board described in [5], wherein the lengths of the first connecting portion and the second connecting portion are the same.

In this wiring circuit board, since the lengths of the first connecting portion and the second connecting portion are the same, the first connecting portion and the second connecting portion can reliably transmit the differential signal.

The present invention [7] includes the wiring circuit board described in [5] or [6], wherein the protruding portion is in contact with the base insulating layer between the first connecting portion and the second connecting portion.

Since the protruding portion is in contact with the base insulating layer between the first connecting portion and the second connecting portion, it is possible to further suppress the peeling of the first connecting portion and the second connecting portion from the base insulating layer.

The present invention [8] includes the wiring circuit board described in [7], wherein the protruding portion has a protruding end edge along the first direction.

In this wiring circuit board, since the protruding end edge is along the first direction, even when an electrode is disposed in each of the first terminal and the second terminal, it is possible to suppress interference between the electrode and the protruding end edge.

The present invention [9] includes the wiring circuit board described in [8], wherein the protruding portion is in contact with the base insulating layer on the opposite side of the second connecting portion with respect to the first connecting portion, and on the opposite side of the first connecting portion with respect to the second connecting portion.

In this wiring circuit board, since the protruding portion is in contact with the base insulating layer on the opposite side of the second connecting portion with respect to the first connecting portion, and on the opposite side of the first connecting portion with respect to the second connecting portion, it is possible to further suppress the peeling of each of the first connecting portion and the second connecting portion from the base insulating layer.

The present invention [10] includes the wiring circuit board described in [5], wherein the first connecting portion and the second connecting portion have a generally Y-shape branching toward a protruding direction of the protruding portion.

In this wiring circuit board, since the protruding portion has the Y-shape, it is possible to design the small protruding portion.

The present invention [11] includes the wiring circuit board described in any one of [1] to [10], wherein a width of the connecting portion is 5 μm or more and 30 μm or less.

In this wiring circuit board, since the width of the connecting portion is 30 μm or less, the peeling of the connecting portion from the base insulating layer is likely to occur.

However, in this wiring circuit board, since the connecting portion is covered with the protruding portion, it is possible to reliably suppress the peeling of the connecting portion from the base insulating layer.

The present invention [12] includes the wiring circuit board described in any one of [1] to [11], wherein the conductive layer has a ground terminal, and a ground wiring connected to the ground terminal and having a width narrower than the width of the ground terminal; the ground wiring has a ground body portion covered with the cover insulating layer; and a length of the terminal in a protruding direction of the protruding portion is shorter than the length of the ground terminal in the protruding direction.

In this wiring circuit board, since the length of the terminal is shorter than the length of the ground terminal, a small electrode can be connected to the terminal, and a ground electrode can be reliably brought into contact with the ground terminal.

The present invention [13] includes the wiring circuit board described in any one of [1] to [12], wherein the ground terminal is larger than the terminal.

In this wiring circuit board, since the ground terminal is larger than the terminal, the small electrode can be connected to the small terminal, and the ground electrode can be reliably brought into contact with the large ground terminal.

The present invention [14] includes the wiring circuit board described in [13] further including a metal support layer disposed on the other surface of the base insulating layer in the thickness direction, wherein the ground terminal is in contact with the metal support layer.

In this wiring circuit board, since the ground terminal is in contact with the metal support layer, it is possible to reliably ground the ground electrode to the metal support layer through the ground terminal.

The present invention [15] includes the wiring circuit board described in any one of [1] to [14], wherein the conductive layer has a metal underlayer disposed on one surface of the base insulating layer in the thickness direction and a conductive body layer disposed on one surface of the metal underlayer in the thickness direction.

In this wiring circuit board, it is possible to improve adhesion of the conductive body layer with respect to the base insulating layer by the metal underlayer.

The present invention [16] includes the wiring circuit board described in [15], wherein a material for the metal underlayer contains chromium.

In this wiring circuit board, since the material for the metal underlayer contains the chromium, it is possible to further improve the adhesion of the conductive body layer with respect to the base insulating layer.

Effect of the Invention

The wiring circuit board of the present invention can suppress peeling of a connecting portion from a base insulating layer.

BRIEF DESCRIPTION OF THE DRAWINGS

FIG. 5A illustrating a step (1) of forming a base insulating layer,

FIG. 5B illustrating a step of forming a metal underlayer,

FIG. 5C illustrating a step of forming a conductive body layer,

FIG. 5D illustrating a step of removing a portion of the metal underlayer, and FIG. 5E illustrating a step (3) of forming a cover insulating layer.

FIG. 6A illustrating a step (1) of forming a base insulating layer,

FIG. 6B illustrating a step of forming a metal underlayer,

FIG. 6C illustrating a step of forming a conductive body layer,

FIG. 6D illustrating a step of removing a portion of the metal underlayer, and FIG. 6E illustrating a step (3) of forming a cover insulating layer.

DESCRIPTION OF EMBODIMENTS

1. Wiring Circuit Board 1

One embodiment of a wiring circuit board of the present invention is described with reference to FIGS. 1 to 6E.

Figure 1:
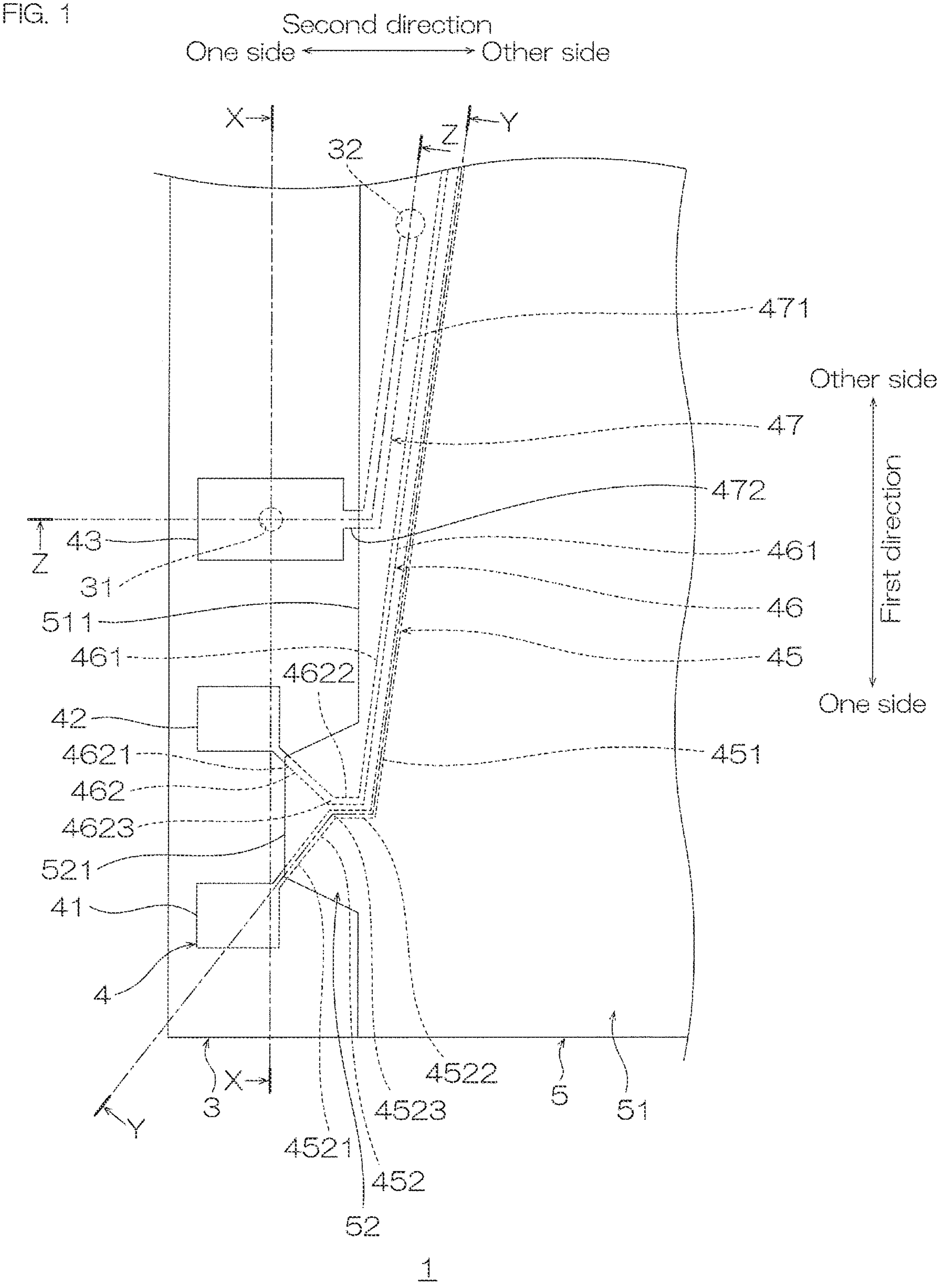
FIG. 1 shows a partially enlarged plan view of one embodiment of a wiring circuit board of the present invention.
Figure 2:
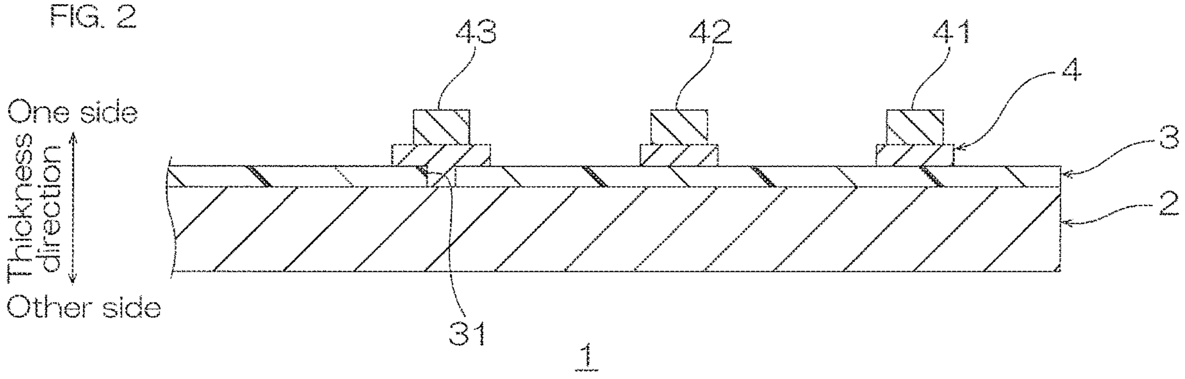
FIG. 2 shows an X-X line cross-sectional view of the wiring circuit board shown in FIG. 1.
Figure 3:
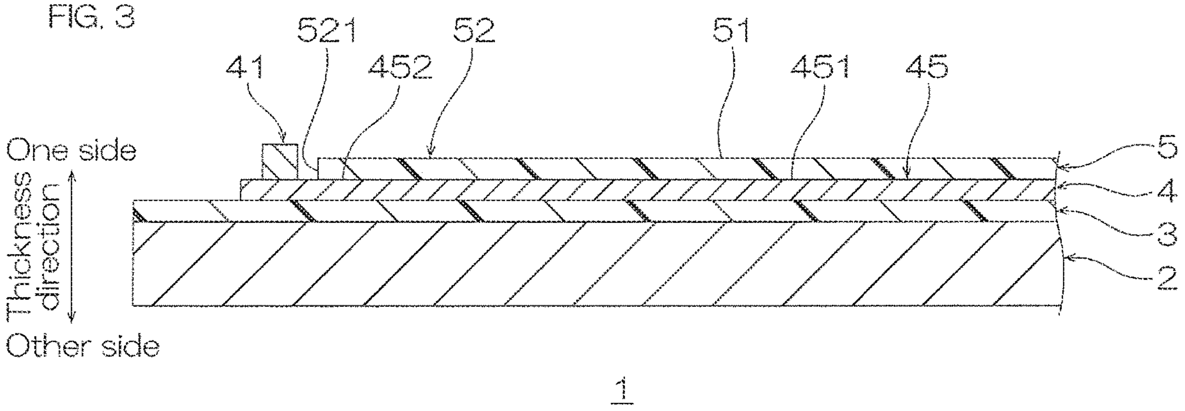
FIG. 3 shows a Y-Y line cross-sectional view of the wiring circuit board shown in FIG. 1.
Figure 4:
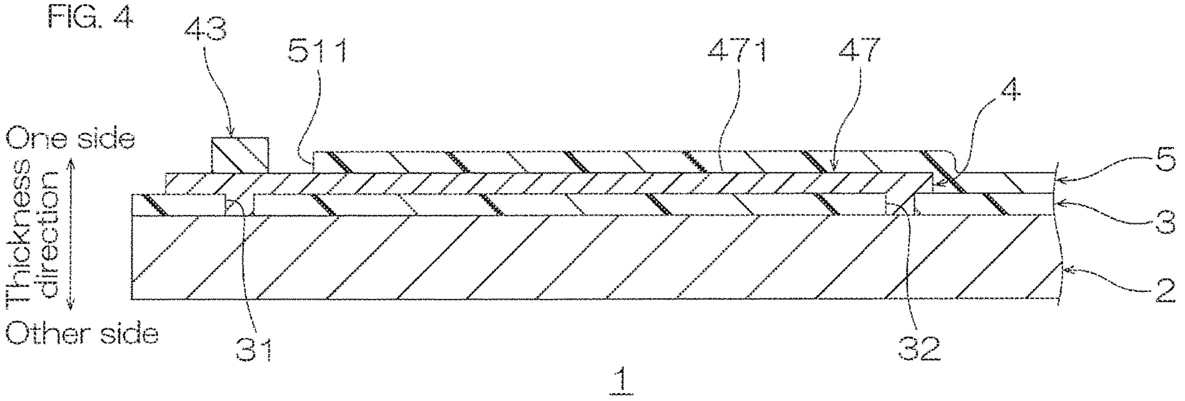
FIG. 4 shows a Z-Z line cross-sectional view of the wiring circuit board shown in FIG. 1.

As shown in FIGS. 1 and 2, a wiring circuit board 1 has a sheet shape. The wiring circuit board 1 has a thickness. The wiring circuit board 1 extends in a plane direction. The plane direction is perpendicular to a thickness direction. The wiring circuit board 1 includes a metal support layer 2, a base insulating layer 3, a conductive layer 4, and a cover insulating layer 5 (ref: FIGS. 3 and 4).

1.1 Metal Support Layer 2

The metal support layer 2 is disposed in a lower end portion of the wiring circuit board 1 in the thickness direction. The metal support layer 2 forms an outer shape of the wiring circuit board 1. Examples of a material for the metal support layer 2 include copper, iron, nickel, chromium, and titanium. These may be used alone or in combination of two or more. As the material for the metal support layer 2, preferably, an alloy is used, more preferably, a copper alloy is used, further more preferably, a copper-titanium alloy is used. The thickness of the metal support layer 2 is, for example, 25 μm or more and 200 μm or less.

1.2 Base Insulating Layer 3

The base insulating layer 3 is disposed on one surface of the metal support layer 2 in the thickness direction. In other words, the metal support layer 2 is disposed on the other surface of the base insulating layer 3 in the thickness direction. The base insulating layer 3 is along the plane direction. The base insulating layer 3 has a plurality of through holes 31 and 32.

The through holes 31 and 32 are spaced from each other in the plane direction. The through holes 31 and 32 penetrate the base insulating layer 3 in the thickness direction.

The material for the base insulating layer 3 is an insulating resin. An example of the insulating resin includes polyimide. The base insulating layer 3 has flexibility. The thickness of the base insulating layer 3 is, for example, 1 μm or more and 100 μm or less.

1.3 Conductive Layer 4

The conductive layer 4 is disposed on one surface of the base insulating layer 3 in the thickness direction. The conductive layer 4 is along the plane direction.

The conductive layer 4 has terminals 41 and 42, a ground terminal 43, wirings 45 and 46, and a ground wiring 47.

The terminals 41 and 42, and the ground terminal 43 are disposed in one end portion of the wiring circuit board 1 in a second direction (described later). The wirings 45 and 46, and the ground wiring 47 are disposed in the other end portion and an intermediate portion of the wiring circuit board 1 in the second direction (described later).

The terminals 41 and 42 include a first terminal 41 and a second terminal 42. The wirings 45 and 46 include a first wiring 45 and a second wiring 46.

1.3.1 First Terminal 41, Second Terminal 42, Ground Terminal 43

The first terminal 41, the second terminal 42, and the ground terminal 43 are disposed in a first direction. The first terminal 41, the second terminal 42, and the ground terminal 43 are disposed in order in the first direction. The first direction is perpendicular to the thickness direction.

The first direction is included in the plane direction. The first terminal 41, the second terminal 42, and the ground terminal 43 are spaced from each other in the first direction. Each of the first terminal 41, the second terminal 42, and the ground terminal 43 has a generally rectangular shape when viewed from the top (same as when viewed from the upper side). Each of the first terminal 41, the second terminal 42, and the ground terminal 43 is long in the second direction. The second direction is perpendicular to the thickness direction. The second direction crosses the first direction. In this embodiment, preferably, the second direction is perpendicular to the first direction. In this embodiment, each of the first terminal 41, the second terminal 42, and the ground terminal 43 has two layers. Or, the first terminal 41, the second terminal 42, and the ground terminal 43 may also have one layer. Preferably, the thicknesses of the first terminal 41, the second terminal 42, and the ground terminal 43 are the same.

Each of the first terminal 41 and the second terminal 42 is smaller than the ground terminal 43. In other words, the ground terminal 43 is larger than each of the first terminal 41 and the second terminal 42.

The first terminal 41 and the second terminal 42 are overlapped with each other when projected in the first direction. Specifically, one end edges of the first terminal 41 and the second terminal 42 in the second direction coincide when projected in the first direction. The other end edges of the first terminal 41 and the second terminal 42 in the second direction coincide when projected in the first direction.

One end edge of the ground terminal 43 in the second direction, the first terminal 41, and the second terminal 42 coincide when projected in the first direction. The other end edge of the ground terminal 43 in the second direction deviates toward the other side in the second direction with respect to the other end edges of the first terminal 41 and the second terminal 42 in the second direction when projected in the first direction.

Therefore, the length of each of the first terminal 41 and the second terminal 42 in the second direction (corresponding to a protruding direction to be described later) is shorter than the length of the ground terminal 43 in the second direction.

The length of each of the first terminal 41 and the second terminal 42 in the first direction is shorter than the length of the ground terminal 43 in the first direction.

The length of each of the first terminal 41 and the second terminal 42 in the second direction is, for example, 50 μm or more, preferably 100 μm or more, and for example, 800 μm or less, preferably 500 μm or less. The length of the ground terminal 43 in the second direction is, for example, 100 μm or more, preferably 150 μm or more, and for example, 1000 μm or less, preferably 600 μm or less.

The length of each of the first terminal 41 and the second terminal 42 in the first direction is, for example, 30 μm or more, preferably 50 μm or more, and for example, 800 μm or less, preferably 500 μm or less. The length of the ground terminal 43 in the first direction is, for example, m or more, preferably 50 μm or more, and for example, 800 μm or less, preferably 500 μm or less. The length of each of the first terminal 41, the second terminal 42, and the ground terminal 43 in the first direction corresponds to the width of each of the first terminal 41, the second terminal 42, and the ground terminal 43.

The outer shape of the ground terminal 43 includes the through hole 31 when viewed from the top. As shown in FIG. 4, the other end portion of the ground terminal 43 in the thickness direction fills the through hole 31. The other end portion of the ground terminal 43 in the thickness direction is in contact with one surface of the metal support layer 2 in the through hole 31, and an inner side surface of the base insulating layer 3 defining the through hole 31. In other words, the ground terminal 43 is in contact with the metal support layer 2. The ground terminal 43 is grounded to the metal support layer 2.

1.3.2 First Wiring 45, Second Wiring 46, Ground Wiring 47

1.3.2.1 First Wiring 45

As shown in FIG. 1, the first wiring 45 is connected to the first terminal 41. The first wiring 45 includes a first body portion 451 and a first connecting portion 452.

The first body portion 451 is disposed in the intermediate portion and the other end portion of the first wiring 45 in the second direction. The first body portion 451 is spaced from the first terminal 41 in the second direction. The first body portion 451 extends in the first direction. In this embodiment, the first body portion 451 may be slightly inclined with respect to the first direction. The first body portion 451 proceeds to one side in the second direction toward one side in the first direction. Also in this embodiment, the first body portion 451 is along the first direction.

The first connecting portion 452 is disposed in one end portion of the first wiring 45 in the second direction. The first connecting portion 452 is disposed between the first body portion 451 and the first terminal 41. The first connecting portion 452 connects the first body portion 451 to the first terminal 41. A direction in which the first connecting portion 452 extends is different from a direction in which the first body portion 451 extends. Specifically, the first connecting portion 452 extends in the second direction. The first connecting portion 452 has a bent shape when viewed from the top. The first connecting portion 452, together with a second connecting portion 462 to be described next, forms a generally Y-shape when viewed from the top. In this embodiment, the first connecting portion 452 integrally has two linear portions 4521 and 4522, and a bent portion 4523.

The linear portion 4521 is disposed in one end portion of the first connecting portion 452 in the second direction. The linear portion 4521 crosses each of the first direction and the second direction. The linear portion 4521 is inclined with respect to the second direction. The linear portion 4521 proceeds to one side in the first direction toward one side in the second direction. One end portion of the linear portion 4521 in the second direction is continuous to the first terminal 41.

The linear portion 4522 is disposed in the other end portion of the first connecting portion 452 in the second direction. The linear portion 4522 extends in the second direction. The other end portion of the linear portion 4522 in the second direction is continuous to the first body portion 451.

The bent portion 4523 is disposed between the two linear portions 4521 and 4522. The bent portion 4523 connects the two linear portions 4521 and 4522.

As described above, the first connecting portion 452 connects the first body portion 451 to the first terminal 41.

The width of each of the linear portions 4521 and 4522, and the bent portion 4523 in the first connecting portion 452 is, for example, 3 μm or more, preferably 5 μm or more, and for example, 30 μm or less, preferably 25 μm or less. When the above-described width is the above-described lower limit or more, it is possible to suppress peeling of the first connecting portion 452 from the base insulating layer 3. When the above-described width is the above-described upper limit or less, the first connecting portion 452 can be made a fine pitch. The width of the first body portion 451 is the same as the width of the first connecting portion 452. Further, the first wiring 45 has the width narrower than the width of the first terminal 41.

1.3.2.2 Second Wiring 46

The second wiring 46 is connected to the second terminal 42. The second wiring 46 is spaced from the first wiring 45. The second wiring 46 includes a second body portion 461 and a second connecting portion 462.

The second body portion 461 is disposed in the intermediate portion and the other end portion of the second wiring 46 in the second direction. The second body portion 461 is spaced from the second terminal 42 in the second direction. The second body portion 461 extends in the first direction. In this embodiment, the second body portion 461 may be slightly inclined with respect to the first direction. The second body portion 461 proceeds to one side in the second direction toward one side in the first direction. Also in this embodiment, the second body portion 461 is along the first direction. The second body portion 461 is disposed adjacent to one side of the first body portion 451 in the second direction.

The second connecting portion 462 is disposed in one end portion of the second wiring 46 in the second direction. The second connecting portion 462 is disposed between the second body portion 461 and the terminal 42. The second connecting portion 462 is disposed facing the other side of the first connecting portion 452 at spaced intervals in the first direction.

The second connecting portion 462 connects the second body portion 461 to the terminal 42. A direction in which the second connecting portion 462 extends is different from a direction in which the second body portion 461 extends. Specifically, the second connecting portion 462 extends in the second direction. The second connecting portion 462 has a bent shape when viewed from the top. In this embodiment, the second connecting portion 462 integrally has two linear portions 4621 and 4622, and a bent portion 4623.

The linear portion 4621 is disposed in one end portion of the second connecting portion 462 in the second direction. The linear portion 4621 crosses each of the first direction and the second direction. The linear portion 4621 is inclined with respect to the second direction. The linear portion 4621 proceeds to the other side in the first direction toward one side in the second direction. One end portion of the linear portion 4621 in the second direction is continuous to the terminal 42.

The linear portion 4622 is disposed in the other end portion of the second connecting portion 462 in the second direction. The linear portion 4622 extends in the second direction. The other end portion of the linear portion 4622 in the second direction is continuous to the second body portion 461.

The bent portion 4623 is disposed between the two linear portions 4621 and 4622. The bent portion 4623 connects the two linear portions 4621 and 4622.

As described above, the second connecting portion 462 connects the second body portion 461 to the terminal 42.

The width of each of the linear portions 4621 and 4622, and the bent portion 4623 in the second connecting portion 462 is, for example, 5 μm or more, preferably 10 μm or more, and for example, 30 μm or less, preferably 25 μm or less. When the above-described width is the above-described lower limit or more, it is possible to suppress the peeling of the second connecting portion 462 from the base insulating layer 3. When the above-described width is the above-described upper limit or less, the second connecting portion 462 can be made the fine pitch. The width of the second body portion 461 is the same as the width of the second connecting portion 462. Further, the second wiring 46 has the width narrower than the width of the second terminal 42.

The first wiring 45 and the second wiring 46 described above are a differential wiring. Specifically, the lengths of the first wiring 45 and the second wiring 46 are the same. At least, the lengths of the first connecting portion 452 and the second connecting portion 462 are the same, and the lengths of the first body portion and the second body portion are the same. The length of the first connecting portion 452 means a wiring length of the first connecting portion 452, specifically, the total sum of the lengths of the linear portion 4521, the linear portion 4522, and the bent portion 4523. The length of each of the first wiring 45 and the second wiring 46 is, for example, 1000 μm or more, preferably 3000 μm or more, and for example, 50000 μm or less, preferably 35000 μm or less.

1.3.2.3 Ground Wiring 47

The ground wiring 47 is connected to the ground terminal 43. The ground wiring 47 has a ground body portion 471. The ground wiring 47, if necessary, may also further include a ground connecting portion 472 connecting the ground body portion 471 to the ground terminal 43.

The ground body portion 471 extends in the first direction. The ground body portion 471 is parallel to the body portions 451 and 461. The outer shape of the end portion of the ground body portion 471 includes the through hole 32 when viewed from the top. The other end portion of the end portion in the thickness direction fills the through hole 32, and is in contact with the metal support layer 2.

The width of the ground wiring 47 is not limited. In this embodiment, the ground connecting portion 472 in the ground wiring 47 has the width narrower than the width of the ground terminal 43. Alternatively, though not shown, the ground connecting portion 472 may have the width wider than or the same as the width of the ground terminal 43. The width of the ground wiring 47 is wider than the width of each of the first wiring 45 and the second wiring 46. The width of the ground wiring 47 is, for example, 5 μm or more, preferably 10 μm or more, and for example, 500 μm or less, preferably 300 μm or less.

1.3.3 Layer Configuration of Conductive Layer 4

Figure 5A:
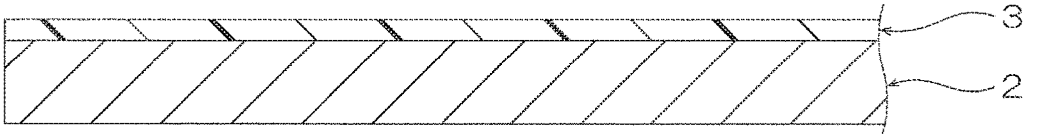
FIGS. 5A to 5E show production process views of the wiring circuit board shown in FIG. 3.
Figure 5B:
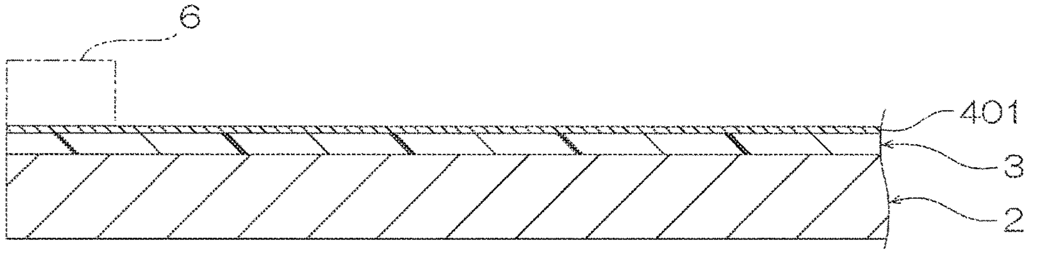
Figure 5C:
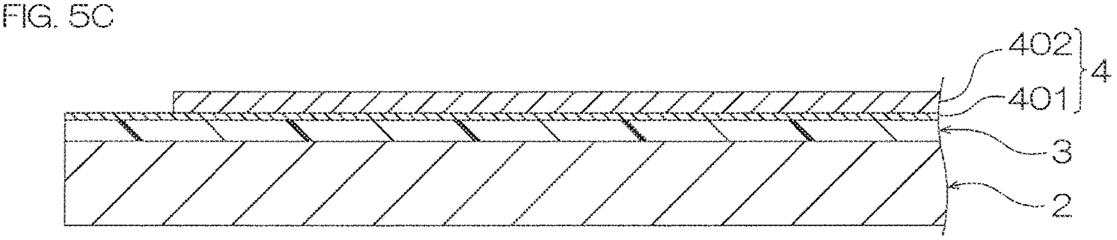
Figure 5D:
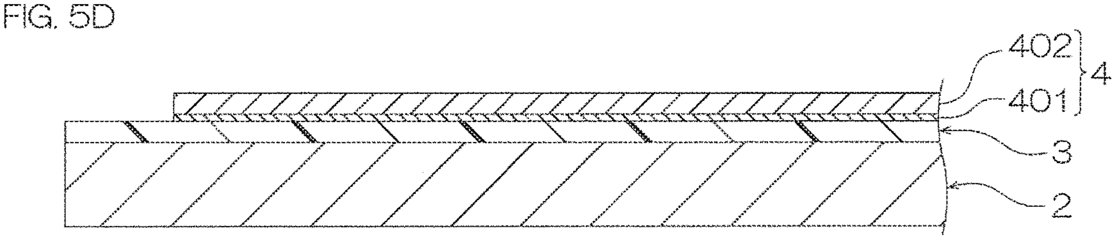
Figure 5E:
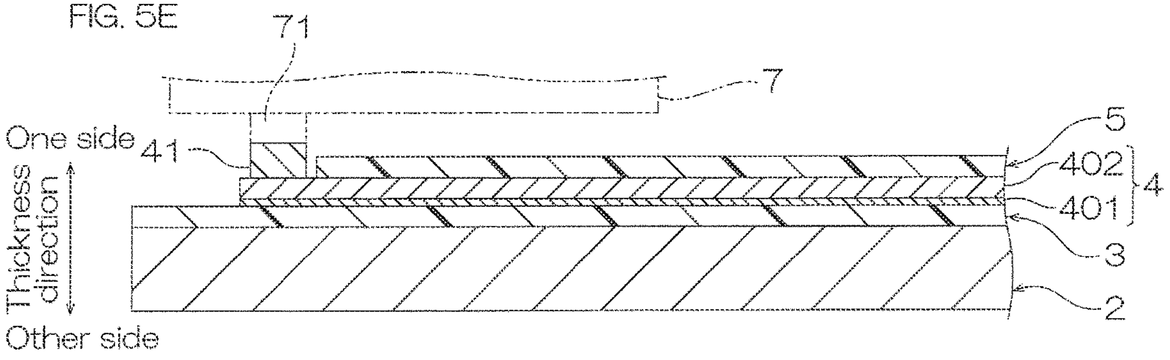
Figure 6A:
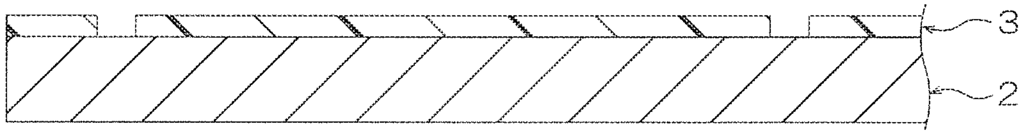
FIGS. 6A to 6E show production process views of the wiring circuit board shown in FIG. 4.
Figure 6B:
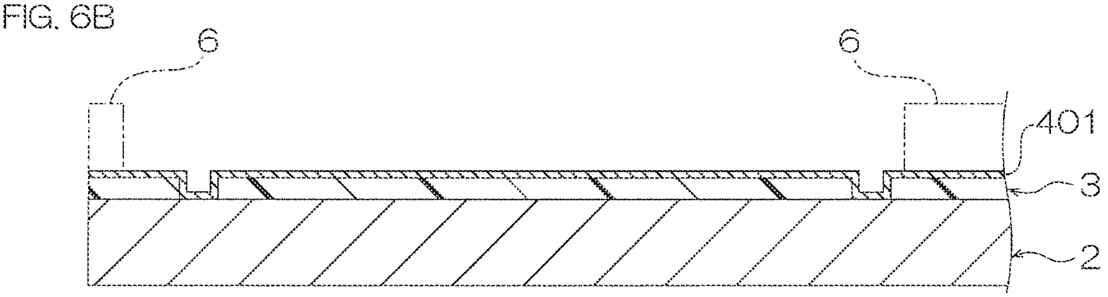
Figure 6C:
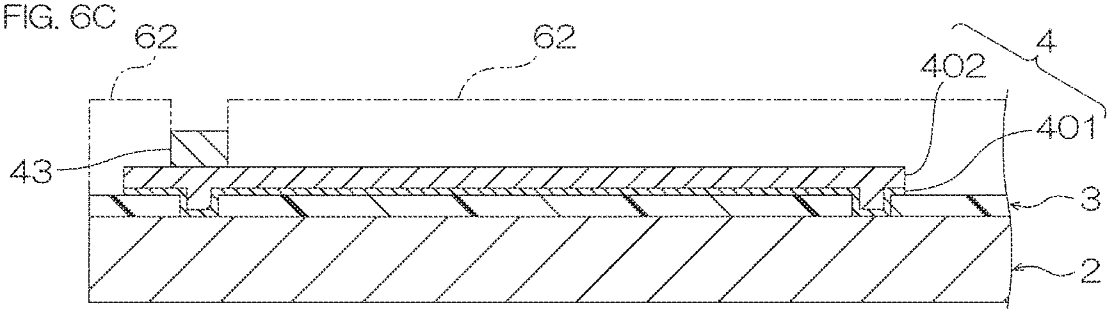
Figure 6D:
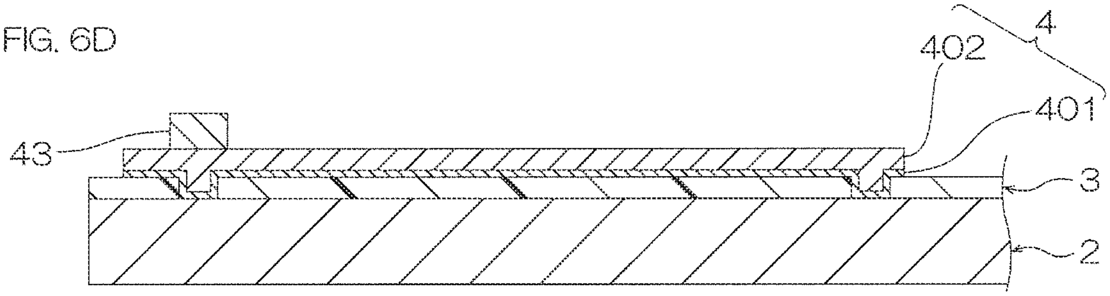
Figure 6E:
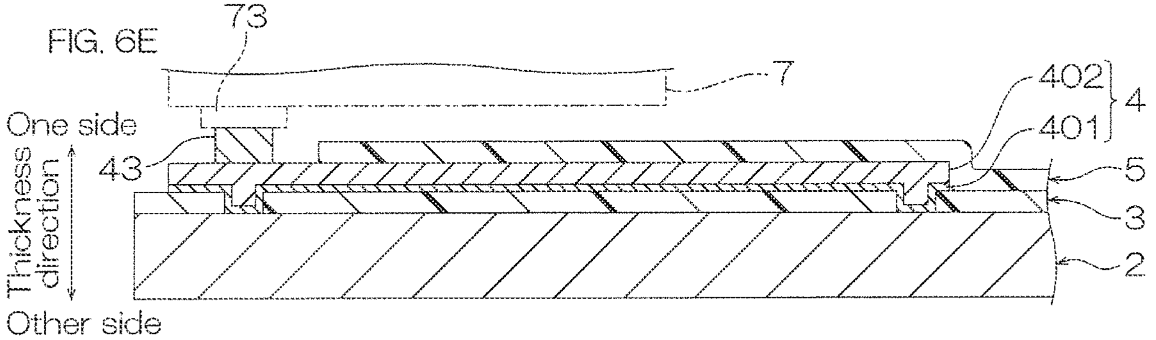

In this embodiment, as shown in FIGS. 5E and 6E, the conductive layer 4 includes a metal underlayer 401 and a conductive body layer 402. The metal underlayer 401 is disposed on one surface of the base insulating layer 3 in the thickness direction. The conductive body layer 402 is disposed on one surface of the metal underlayer 401 in the thickness direction. A boundary between the metal underlayer 401 and the conductive body layer 402, as shown in FIGS. 5E and 6E, may be clearly observed, or as shown in FIGS. 2 to 4, may not be clearly observed.

Examples of the material for the metal underlayer 401 include chromium and copper. These are used alone or in combination of two or more. The metal underlayer 401 may be a single layer or multiple layers. Preferably, the metal underlayer 401 includes a chromium layer and a copper layer in order toward one side in the thickness direction. In other words, preferably, the material for the metal underlayer 401 contains chromium. The thickness of the metal underlayer 401 is, for example, 0.01 μm or more and 1 μm or less.

An example of the material for the conductive body layer 402 includes metal, and preferably, copper is used. The thickness of the conductive body layer 402 is, for example, 5 μm or more and 100 μm or less.

The thickness of the conductive layer 4 is, for example, 6 μm or more and 110 μm or less. The ground terminal 43 may be thicker than the terminals 41 and 42. Examples of the material for the conductive layer 4 include the above-described metals, and preferably, copper is contained as a main component.

1.4 Cover Insulating Layer 5

As shown in FIGS. 3 and 4, the cover insulating layer 5 is disposed on one surface of the base insulating layer 3 in the thickness direction. The cover insulating layer 5 is along the plane direction. The cover insulating layer 5 covers a portion of the conductive layer 4. The cover insulating layer 5 has a cover body portion 51 and a protruding portion 52.

1.4.1 Cover Body Portion 51

As shown in FIG. 1, the cover body portion 51 is disposed from the intermediate portion over the other end portion of the wiring circuit board 1 in the second direction. The cover body portion 51 extends in the first direction. The cover body portion 51 has an end edge 511. The end edge 511 extends in the first direction. The end edge 511 is spaced from the other side with respect to the first terminal 41, the second terminal 42, and the ground terminal 43 in the second direction. That is, each of the first terminal 41, the second terminal 42, and the ground terminal 43 is exposed from the cover insulating layer 5. The cover body portion 51 covers the first body portion 451, the second body portion 461, and the ground body portion 471. Specifically, the cover body portion 51 is in contact with one surfaces of the first body portion 451, the second body portion 461, and the ground body portion 471 in the thickness direction, and the side surfaces of the first body portion 451, the second body portion 461, and the ground body portion 471.

1.4.2 Protruding Portion 52

The protruding portion 52 protrudes from the cover body portion 51. The protruding portion 52 protrudes in the second direction. Specifically, the protruding portion 52 protrudes from the end edge 511 of the cover body portion 51 toward one side in the second direction. The protruding portion 52 has a generally rectangular shape when viewed from the top.

The protruding portion 52 has a protruding end edge 521. The protruding end edge 521 is disposed at one side (protruding-side) with respect to the end edge 511 in the second direction. The protruding end edge 521 is along the first direction. The protruding end edge 521 is parallel to the end edge 511. In this embodiment, the protruding end edge 521 is disposed between the other end edges of the terminals 41 and 42 in the second direction and the end edge 511 when projected in the first direction. Further, the protruding end edge 521 is disposed between the other end edges of the terminals 41 and 42 in the second direction and the other end edge of the ground terminal 43 in the second direction when projected in the first direction.

The protruding portion 52 is disposed between one end edge of the terminal 41 in the first direction and the other end edge of the terminal 42 in the first direction when projected in the second direction. The protruding portion 52 is overlapped with the other end portion of the terminal 41 in the first direction and one end portion of the terminal 42 in the first direction when projected in the second direction.

The protruding portion 52 covers the first connecting portion 452 and the second connecting portion 462. Specifically, the protruding portion 52 is in contact with one surface of each of the first connecting portion 452 and the second connecting portion 462 in the thickness direction and the side surface of each of the first connecting portion 452 and the second connecting portion 462.

The protruding portion 52 is in contact with the base insulating layer 3 between the first connecting portion 452 and the second connecting portion 462. The protruding portion 52 is in contact with the base insulating layer 3 on the opposite side of the second connecting portion 462 with respect to the first connecting portion 452, and on the opposite side of the first connecting portion 452 with respect to the second connecting portion 462.

The material for the cover insulating layer 5 is an insulating resin. An example of the insulating resin includes polyimide. The cover insulating layer 5 has the flexibility. The thickness of the cover insulating layer 5 is, for example, 1 μm or more and 100 μm or less.

1.5 Method for Producing Wiring Circuit Board 1

A method for producing the wiring circuit board 1 includes steps (1) to (3).

As shown in FIGS. 5A and 6A, in the step (1), the base insulating layer 3 is formed on one surface of the metal support layer 2 in the thickness direction. For example, a photosensitive composition containing the insulating resin is coated onto one surface of the metal support layer 2 in the thickness direction and dried to be then exposed.

In the step (2), the conductive layer 4 is formed on one surface of the base insulating layer 3 in the thickness direction. For example, the conductive layer 4 is formed using an additive method or a subtractive method. Preferably, the conductive layer 4 is formed using the additive method.

In the additive method, first, as shown in FIGS. 5B and 6B, the metal underlayer 401 is formed on one surface of the base insulating layer 3 in the thickness direction. For example, the metal underlayer 401 is formed using a thin film forming method. Examples of the thin film forming method include sputtering and plating. As the thin film forming method, preferably, sputtering is used.

In the additive method, next, as shown by phantom lines in FIGS. 5B and 6B, a plating resist 6 is formed on one surface of the metal underlayer 401 in the thickness direction. The plating resist 6 is formed in an inverted pattern of the conductive layer 4.

In the additive step, thereafter, as shown in FIGS. 5C and 6C, the conductive body layer 402 is deposited with respect to the metal underlayer 401 which is exposed from the plating resist 6 using the plating. Examples of the plating include electrolytic plating and electroless plating. As the plating, preferably, the electroless plating is used. If necessary, by further plating using a second plating resist 62 (ref: phantom line in FIG. 6C), one end portion of the ground terminal 43 in the thickness direction may be also formed.

Thereafter, as shown in FIGS. 5D and 6D, the metal underlayer 401 which is exposed from the conductive body layer 402 is removed.

Thus, the conductive layer 4 is formed.

As shown in FIGS. 5E and 6E, in the step (3), the cover insulating layer 5 is formed on one surface of the base insulating layer 3 in the thickness direction so as to cover a portion of the conductive layer 4. For example, the photosensitive composition containing the insulating resin is coated onto the base insulating layer 3 and the conductive layer 4 and dried to be then exposed.

Thus, the wiring circuit board 1 is produced.

Thereafter, for example, an external device 7 is disposed on one side in the thickness direction of the wiring circuit board 1, and electrodes 71 and 72, and a ground electrode 73 of the external device 7 are brought into contact with the terminals 41 and 42, and the ground terminal 43, respectively. At this time, if necessary, an electrically conductive adhesive which is not shown is used.

2. Function and Effect of One Embodiment

In the wiring circuit board 1, as shown in FIG. 1, the cover insulating layer 5 has the protruding portion 52 covering the first connecting portion 452 and the second connecting portion 462. Therefore, it is possible to suppress the peeling of the first connecting portion 452 and the second connecting portion 462 from the base insulating layer 3.

When the direction in which each of the first connecting portion 452 and the second connecting portion 462 extends is different from the direction in which each of the first body portion 451 and the second body portion 461 extends, each of the first connecting portion 452 and the second connecting portion 462 is likely to be exposed.

However, in the wiring circuit board 1, since the protruding portion 52 covers the first connecting portion 452 and the second connecting portion 462, it is possible to suppress the peeling caused by the exposure of the first connecting portion 452 and the second connecting portion 462.

In the wiring circuit board 1, since the protruding portion 52 protrudes in the second direction, it is possible to reliably cover the first connecting portion 452 and the second connecting portion 462.

In the wiring circuit board 1, since the first connecting portion 452 and the second connecting portion 462 are covered with the protruding portion 52, it is possible to reliably suppress the peeling of the first connecting portion 452 and the second connecting portion 462 from the base insulating layer 3.

In the wiring circuit board 1, since the lengths of the first connecting portion 452 and the second connecting portion 462 are the same, the first connecting portion 452 and the second connecting portion 462 can reliably transmit the differential signal.

Since the protruding portion 52 is in contact with the base insulating layer 3 between the first connecting portion 452 and the second connecting portion 462, it is possible to further suppress the peeling of the first connecting portion 452 and the second connecting portion 462 from the base insulating layer 3.

In the wiring circuit board 1, since the protruding end edge 521 is along the first direction, even when each of the electrodes 71 and 72 of the external device 7 is disposed in each of the first terminal 41 and the second terminal 42, it is possible to suppress interference between the electrodes 71 and 72 and the protruding end edge 521. Furthermore, even when the electrically conductive adhesive is disposed in the first terminal 41 and the second terminal 42, it is possible to minimize the influence of the electrically conductive adhesive on the wettability.

In the wiring circuit board 1, since the protruding portion 52 is in contact with the base insulating layer 3 on the opposite side of the second connecting portion 462 with respect to the first connecting portion 452, and on the opposite side of the first connecting portion 452 with respect to the second connecting portion 462, it is possible to further suppress the peeling of each of the first connecting portion 452 and the second connecting portion 462 from the base insulating layer 3.

In the wiring circuit board 1, when the width of each of the first connecting portion 452 and the second connecting portion 462 is 30 μm or less, the peeling of each of the first connecting portion 452 and the second connecting portion 462 from the base insulating layer 3 is likely to occur.

However, in the wiring circuit board 1, since the first connecting portion 452 and the second connecting portion 462 are covered with the protruding portion 52, it is possible to reliably suppress the peeling of the first connecting portion 452 and the second connecting portion 462 from the base insulating layer 3.

In the wiring circuit board 1, since the lengths of the terminals 41 and 42 are shorter than the length of the ground terminal 43, the small electrodes 71 and 72 can be connected to the terminals 41 and 42, and the ground electrode 73 can be reliably brought into contact with the external ground terminal 43.

In the wiring circuit board 1, since the ground terminal 43 is larger than the terminals 41 and 42, the small electrodes 71 and 72 can be connected to the small terminals 41 and 42, and the ground electrode 73 can be reliably brought into contact with the large ground terminal 43.

In the wiring circuit board 1, since the ground terminal 43 is in contact with the metal support layer 2, it is possible to reliably ground the ground electrode 73 in the external device 7 to the metal support layer 2 through the ground terminal 43.

3. Modified Examples

In each modified example, the same reference numerals are provided for members and steps corresponding to each of those in one embodiment, and their detailed description is omitted. Further, each modified example can achieve the same function and effect as that of one embodiment unless otherwise specified. Furthermore, one embodiment and each modified example can be appropriately used in combination.

3.1 First Modified Example

Figure 7:
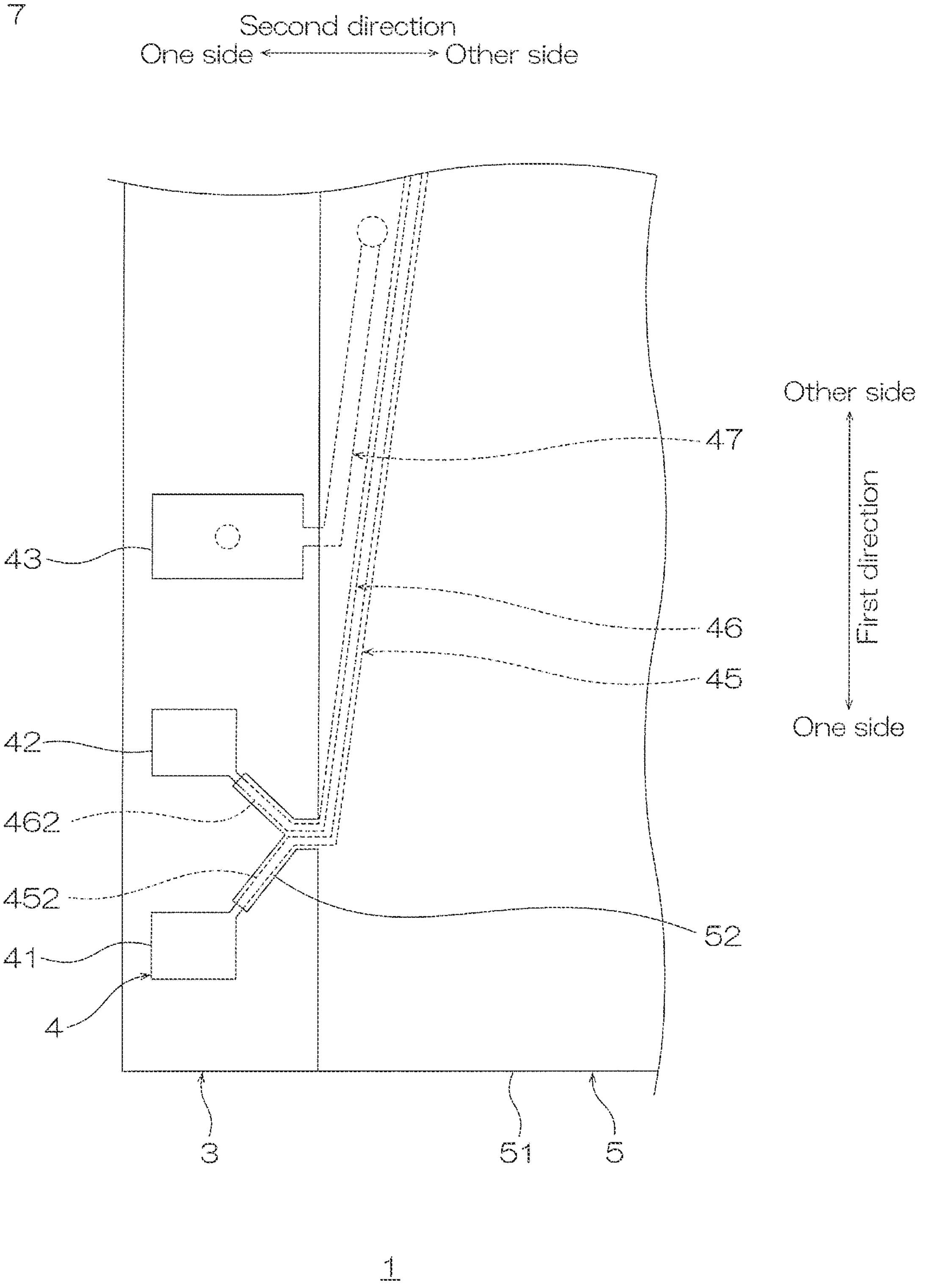
FIG. 7 shows a partially enlarged plan view of a first modified example.

As shown in FIG. 7, the protruding portion 52 has a generally Y-shape branching toward one side (protruding direction of the protruding portion 52) in the second direction. The protruding portion 52 has a pattern shape corresponding to the first connecting portion 452 and the second connecting portion 462.

In the first modified example, the protruding portion 52 is not in contact with the base insulating layer 3 between the first connecting portion 452 and the second connecting portion 462. The protruding portion 52 is not in contact with the opposite side of the second connecting portion 462 with respect to the first connecting portion 452. The protruding portion 52 is not in contact with the base insulating layer 3 on the opposite side of the first connecting portion 452 with respect to the second connecting portion 462.

In the first modified example, since the protruding portion 52 has the Y-shape, it is possible to design the small protruding portion 52 as compared with one embodiment.

3.2 Second Modified Example

Figure 8:
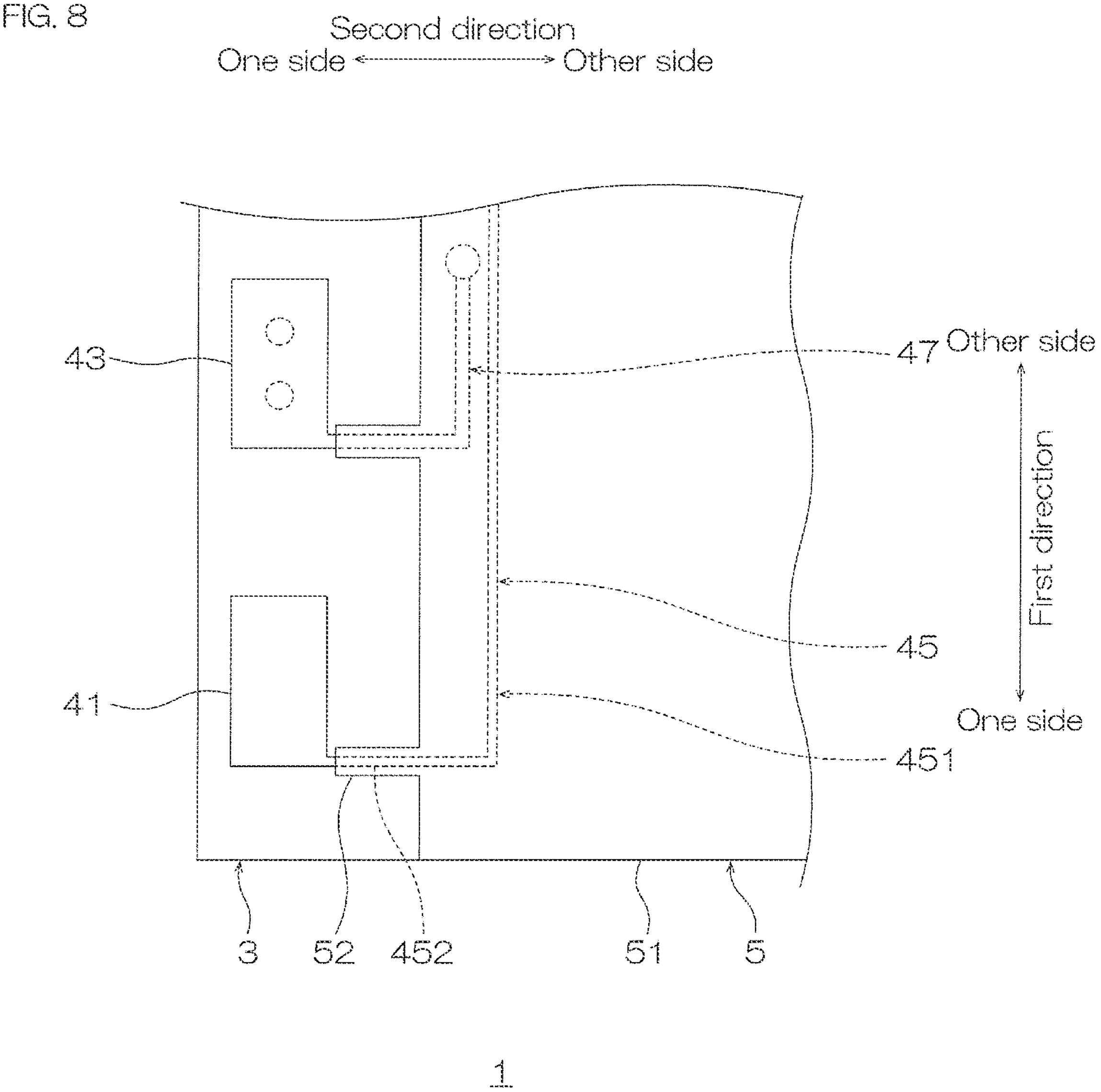
FIG. 8 shows a partially enlarged plan view of a second modified example.

In the second modified example, as shown in FIG. 8, the first wiring 45 may not be the differential wiring. The first connecting portion 452 has a linear shape. The first connecting portion 452 extends in the second direction.

The protruding portion 52 has the linear shape. The protruding portion 52 extends in the second direction.

In the second modified example, each of the terminal 41 and the ground terminal 43 is long in the first direction.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF REFERENCE NUMERALS

1 Wiring circuit board
2 Metal support layer
3 Base insulating layer
4 Conductive layer
41 First terminal
42 Second terminal
43 Ground terminal
45 First wiring
46 Second wiring
47 Ground wiring
401 Metal underlayer (conductive layer)
402 Conductive body layer (conductive layer)
451 First body portion
452 First connecting portion
461 Second body portion
462 Second connecting portion
471 Ground body portion
472 Ground connecting portion
5 Cover insulating layer
51 Cover body portion
52 Protruding portion
511 End edge (cover body portion)
521 Protruding end edge (protruding portion)

The invention claimed is:

1. A wiring circuit board comprising:

a base insulating layer, a conductive layer disposed on one surface of the base insulating layer in a thickness direction, and a cover insulating layer disposed on one surface of the base insulating layer in the thickness direction and covering a portion of the conductive layer, wherein the conductive layer has
- a terminal, and
- a wiring connected to the terminal and having a width narrower than the width of the terminal;

the wiring has
- a body portion, and
- a connecting portion connecting the body portion to the terminal; and the cover insulating layer has
- a cover body portion covering the body portion and having an end edge along a first direction perpendicular to the thickness direction, and
- a protruding portion covering the connecting portion and protruding from the end edge of the cover body portion in a second direction being perpendicular to the thickness direction and crossing the first direction; and the base insulating layer has
- a first portion covered with the protruding portion, and
- a second portion disposed at both sides of the protruding portion in the first direction and exposed from the cover insulating layer.

2. The wiring circuit board according to claim 1, wherein a direction in which the connecting portion extends is different from a direction in which the body portion extends.

3. The wiring circuit board according to claim 1, wherein the body portion is along the first direction.

4. The wiring circuit board according to claim 3, wherein
the terminal includes a first terminal and a second terminal,
the wiring includes a first wiring and a second wiring,
the first wiring includes a first body portion and a first connecting portion,
the second wiring includes a second body portion and a second connecting portion, and
the first wiring and the second wiring are a differential wiring.

5. The wiring circuit board according to claim 4, wherein
the lengths of the first connecting portion and the second connecting portion are the same.

6. The wiring circuit board according to claim 4, wherein
the protruding portion is in contact with the base insulating layer between the first connecting portion and the second connecting portion.

7. The wiring circuit board according to claim 6, wherein
the protruding portion has a protruding end edge along the first direction.

8. The wiring circuit board according to claim 7, wherein
the protruding portion is in contact with the base insulating layer on the opposite side of the second connecting portion with respect to the first connecting portion, and on the opposite side of the first connecting portion with respect to the second connecting portion.

9. The wiring circuit board according to claim 4, wherein
the first connecting portion and the second connecting portion have a generally Y-shape branching toward a protruding direction of the protruding portion.

10. The wiring circuit board according to claim 1, wherein
a width of the connecting portion is 5 μm or more and 30 μm or less.

11. The wiring circuit board according to claim 1, wherein
the conductive layer has
a ground terminal, and
a ground wiring connected to the ground terminal and having a width narrower than the width of the ground terminal;
the ground wiring has a ground body portion covered with the cover insulating layer; and
a length of the terminal in a protruding direction of the protruding portion is shorter than the length of the ground terminal in the protruding direction.

12. The wiring circuit board according to claim 11, wherein
the ground terminal is larger than the terminal.

13. The wiring circuit board according to claim 12 further comprising:
a metal support layer disposed on the other surface of the base insulating layer in the thickness direction,
wherein the ground terminal is in contact with the metal support layer.

14. The wiring circuit board according to claim 1, wherein
the conductive layer has
a metal underlayer disposed on one surface of the base insulating layer in the thickness direction and
a conductive body layer disposed on one surface of the metal underlayer in the thickness direction.

15. The wiring circuit board according to claim 14, wherein
a material for the metal underlayer contains chromium.

* * * * *